United States Patent
Seo et al.

(10) Patent No.: US 8,593,307 B2
(45) Date of Patent: Nov. 26, 2013

(54) METHODS OF COMPRESSING DATA IN STORAGE DEVICE

(75) Inventors: Man-keun Seo, Hwaseong-si (KR);
Jun-jin Kong, Yongin-si (KR);
Hong-rak Son, Anyang-si (KR);
Kyoung-Lae Cho, Yongin-si (KR);
Je-hyuck Song, Seoul (KR); Kwang-gu Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

(21) Appl. No.: 13/364,787

(22) Filed: Feb. 2, 2012

(65) Prior Publication Data

US 2012/0242517 A1    Sep. 27, 2012

(30) Foreign Application Priority Data

Mar. 25, 2011    (KR) .................. 10-2011-0027176

(51) Int. Cl.
*H03M 7/40*    (2006.01)

(52) U.S. Cl.
USPC .............................................. 341/65; 341/67

(58) Field of Classification Search
USPC ........................................................ 341/65, 67
See application file for complete search history.

(56) References Cited

U.S. PATENT DOCUMENTS

| 4,700,175 | A | * | 10/1987 | Bledsoe | 341/65 |
| 4,899,149 | A | * | 2/1990 | Kahan | 341/67 |
| 5,786,780 | A | | 7/1998 | Park et al. | |
| 6,636,167 | B1 | * | 10/2003 | Acharya et al. | 341/65 |
| 6,646,577 | B2 | * | 11/2003 | Acharya et al. | 341/67 |
| 7,071,853 | B2 | * | 7/2006 | Price | 341/65 |
| 7,375,660 | B1 | * | 5/2008 | Chang et al. | 341/65 |
| 7,436,329 | B2 | | 10/2008 | Lynch et al. | |

FOREIGN PATENT DOCUMENTS

JP    2002-374173 A    12/2002
KR         0139162 B1    6/1996

* cited by examiner

*Primary Examiner* — Khai M Nguyen
(74) *Attorney, Agent, or Firm* — Harness, Dickey & Pierce, P.L.C.

(57) ABSTRACT

At least one example embodiment discloses a method of compressing data in a storage device. The method includes determining a codeword length of a symbol using a first table indicating a relationship between a number of occurrences of the symbol in received data and the codeword length, determining a codeword having the codeword length for the symbol, and generating compressed data of the received data, the generating including converting the symbol into the codeword.

19 Claims, 14 Drawing Sheets

FIG. 9

TABL 1

| THE NUMBER OF OCCURRENCES | CODEWORD LENGTH |
|---|---|
| 1 | 12 |
| 2 | 11 |
| 3-4 | 10 |
| 5-9 | 9 |
| 10-20 | 8 |
| 21-40 | 7 |
| 41-80 | 6 |
| 81-170 | 5 |
| 171-200 | 4 |

FIG. 14

TABL 2

| NUMBER OF OCCURRENCES | CODEWORD LENGTH |
|---|---|
| 1 | 10 |
| 2 | 9 |
| 3-4 | 8 |
| 5-9 | 7 |
| 10-20 | 6 |
| 21-40 | 5 |
| 41-80 | 4 |
| 81-170 | 3 |
| 171-200 | 2 |

METHODS OF COMPRESSING DATA IN STORAGE DEVICE

CROSS-REFERENCE TO RELATED APPLICATIONS

This application claims priority to Korean Patent Application No. 10-2011-0027176, filed on Mar. 25, 2011, in the Korean Intellectual Property Office, the entire contents of which are incorporated herein by reference.

BACKGROUND

Inventive concepts relate to methods of compressing data in a storage device, and more particularly, to methods of compressing data in a storage device whereby an increase in the amount of calculation required for data compression and latency of operation can be reduced.

Conventionally, pieces of data are compressed before the pieces of data are stored in a storage device so that space for storing data can be efficiently used and the number at which data are programmed or read, can be reduced and the life-span of the storage device can be lengthened.

SUMMARY

Inventive concepts provide methods of compressing data in a storage device whereby a large amount of data can be compressed within a short time and the time of latency due to data compression can be minimized.

According to an aspect of inventive concepts, there is provided a method of compressing data in a storage device, the method including, determining a codeword length of a symbol using a first table indicating a relationship between number of occurrences of the symbol in received data and the codeword length, determining a codeword having the codeword length for the symbol, and generating compressed data of the received data, the generating including converting the symbol into the codeword.

The determining a codeword length includes determining the number of occurrences of the symbol in the received data, and determining the codeword length corresponding to the number of occurrences of the symbol in the received data using the first table.

The method may further include generating the first table. The generating the first table includes receiving test data, calculating probabilities of a number of occurrences of each symbol in the test data, generating a Huffman tree based on the probabilities, and matching each symbol in the test data to at least one of the codeword lengths based on the Huffman tree.

The test data may be data having the same type of data as the data.

The received data may include decoded data generated by decoding a part of program data to be stored in a storage region of the solid state drive and a header indicating at least one parameter regarding the decoded data. In this case, the at least one parameter may be at least one information from the decoding method, the size of the decoded data and compressibility of the decoded data.

The first table may include a first sub-table indicating a first relationship between each symbol and each codeword length and a second sub-table indicating a second relationship between each symbol and each codeword length.

The solid-state drive (SSD) may be included in the server.

According to another aspect of inventive concepts, there is provided a method of compressing data in a storage device, the method includes, sorting data into a first type of first data and a second type of second data; first determining first codeword lengths corresponding to symbols in the first data using a first table indicating a relationship between a number of occurrences of each symbol in the first data and the determined first codeword length, first compressing the first data by converting each symbol in the first data into a first corresponding codeword having the corresponding codeword length, second determining second codeword lengths corresponding to symbols included in the second data using a second table indicating a relationship between a number of occurrences of each symbol in the second data and the determined second codeword length, and second compressing the second data by converting each symbol in the second data into a second corresponding codeword having the corresponding second codeword length.

A method of compressing data, the method including receiving data, the data including a plurality of symbols, determining a number of occurrences at least one of the plurality of symbols in the data, determining a codeword length of the at least one symbol using a table, the table indicating a relationship between the number of occurrences and the codeword length, and converting the at least one symbol into a codeword having the codeword length.

BRIEF DESCRIPTION OF THE DRAWINGS

Example embodiments of inventive concepts will be more clearly understood from the following detailed description taken in conjunction with the accompanying drawings in which:

FIG. 9 illustrates an example of a first table according to an example embodiment of inventive concepts;

FIG. 14 illustrates an example of a second table according to another example embodiment of inventive concepts;

DETAILED DESCRIPTION OF EXAMPLE EMBODIMENTS

Figure 1:
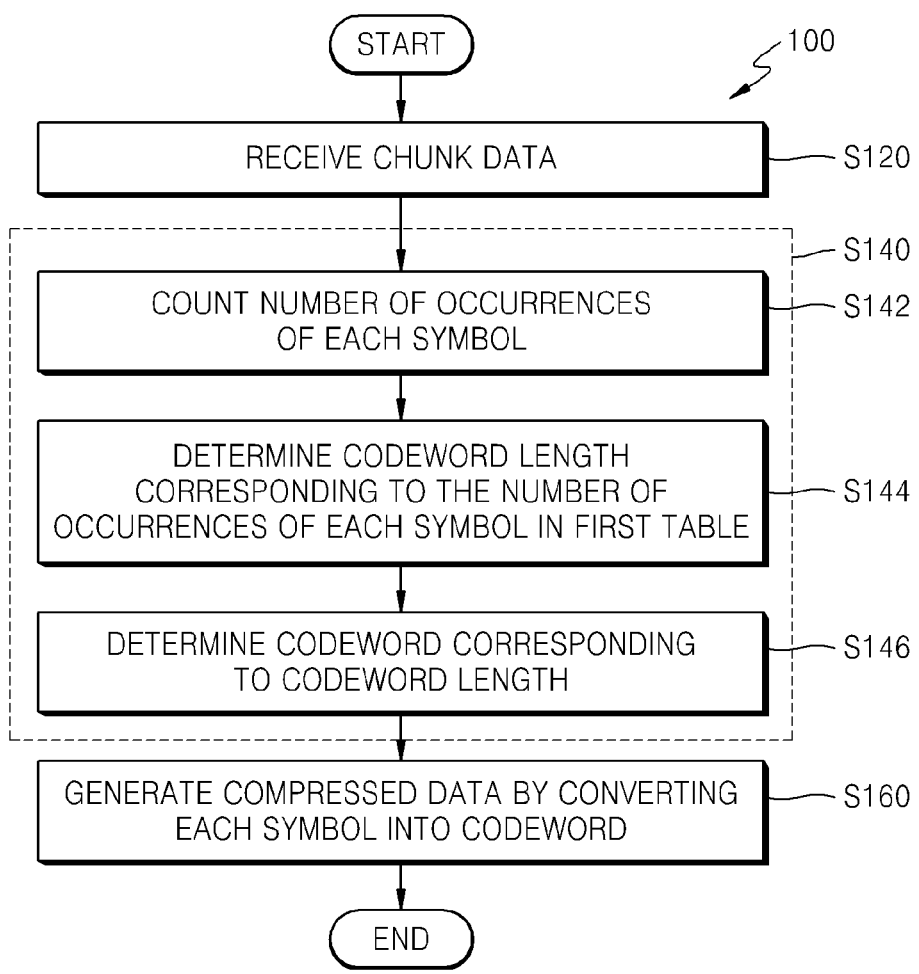
FIG. 1 is a flowchart of a method of compressing data in a storage device, according to an example embodiment of inventive concepts.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
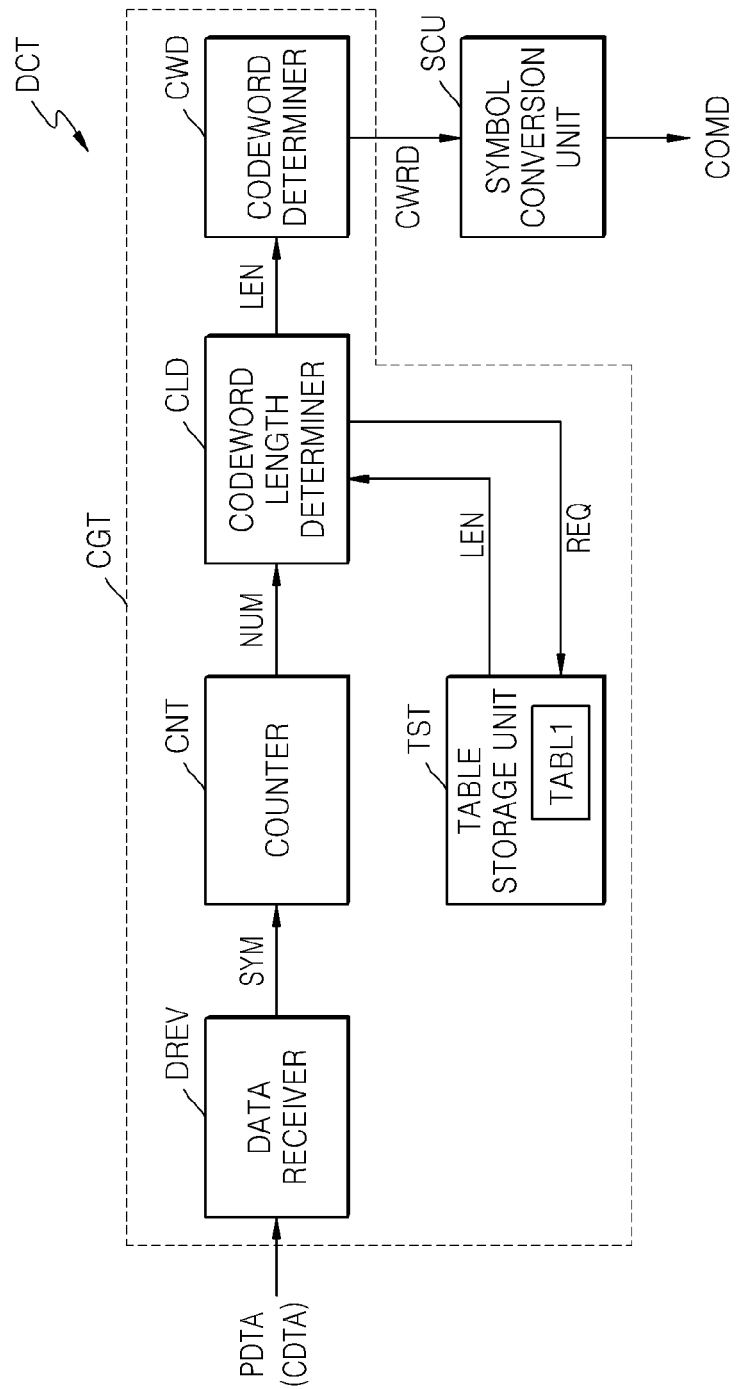
FIG. 2 is a block diagram of a data compression unit that operates by using the method of compressing data in a storage device illustrated in FIG. 1 according to an example embodiment.

FIG. 1 is a flowchart of a method of compressing data in a storage device (100), according to an example embodiment of inventive concepts. FIG. 2 is a block diagram of a data compression unit DCT that operates by using the method of compressing data in a storage device (100) illustrated in FIG. 1.

Referring to FIGS. 1 and 2, the method of compressing data in a storage device (100) may include receiving chunk data CDTA (S120), determining a codeword CWRD by using a first table TABL1 indicating a relationship between a number of occurrences NUM and a length LEN of the codeword CWRD of a symbol SYM included in each chunk data CDTA (S140) and generating compressed data COMD by converting each symbol SYM of each chunk data CDTA (S160).

The data compression unit DCT of FIG. 2 that operates by using the method of compressing data in a storage device (100) of FIG. 1, may include a codeword generation unit CGT for generating a codeword CWRD and a symbol conversion unit SCU for generating compressed data COMD by converting each symbol SYM of each chunk data CDTA by using the codeword CWRD. The codeword generation unit CGT includes a data receiver DREV, a counter CNT, a codeword length determiner CLD, a codeword determiner CWD and a table storage unit TST. A more detailed description of the structure and operation of the data compression unit DCT will be provided later.

The method of compressing data in a storage device (100) of FIG. 1 may be used in various types of storage devices. In particular, the method of compressing data in a storage device (100) of FIG. 1 may be used in a solid-state drive (SSD) among storage devices. Thus, the data compression unit DCT of FIG. 2 may be included in the solid-state drive (SSD). For convenience of explanation, an example where the method of compressing data in a storage device (100) of FIG. 1 is used in the SSD will now be described. However, inventive concepts are not limited thereto, and the method of compressing data in a storage device (100) of FIG. 1 may be used in other storage devices. This also applies to methods of compressing data in a storage device, according to other example embodiments of inventive concepts that will be described later.

The chunk data CDTA may be a unit for compressing data (program data PDTA) to be programmed in a flash memory included in the SSD. For example, when the SSD is mapped in units of 4 KB, the chunk data CDTA may be set as 4 KB.

When the program data PDTA is compressed before being programmed, a data storage space may be used, and a number at which data are written or read may be reduced so that a life-span of the storage device may be lengthened. However, a storage device, such as an SSD, requires high input/output (I/O) throughput. Thus, in the method of compressing data in the SSD (100) and the data compression unit, a large amount of data is compressed within a short time, and the time of latency due to data compression is shortened.

In order to compress a large amount of data within a short time, in the method of compressing data in the SSD (100) and the data compression unit DCT, data compression may be performed in an entropy coding manner. In the method of compressing data in the SSD (100) and the data compression unit DCT, the chunk data CDTA may be compressed using the Huffman coding method among entropy coding methods, by which a short codeword CWRD is allocated to a symbol SYM having the large number of occurrences NUM among symbols SYM included in the chunk data CDTA and a relatively long codeword CWRD is allocated to a symbol SYM having the small number of occurrences NUM among the symbols SYM included in the chunk data CDTA.

Figure 3:
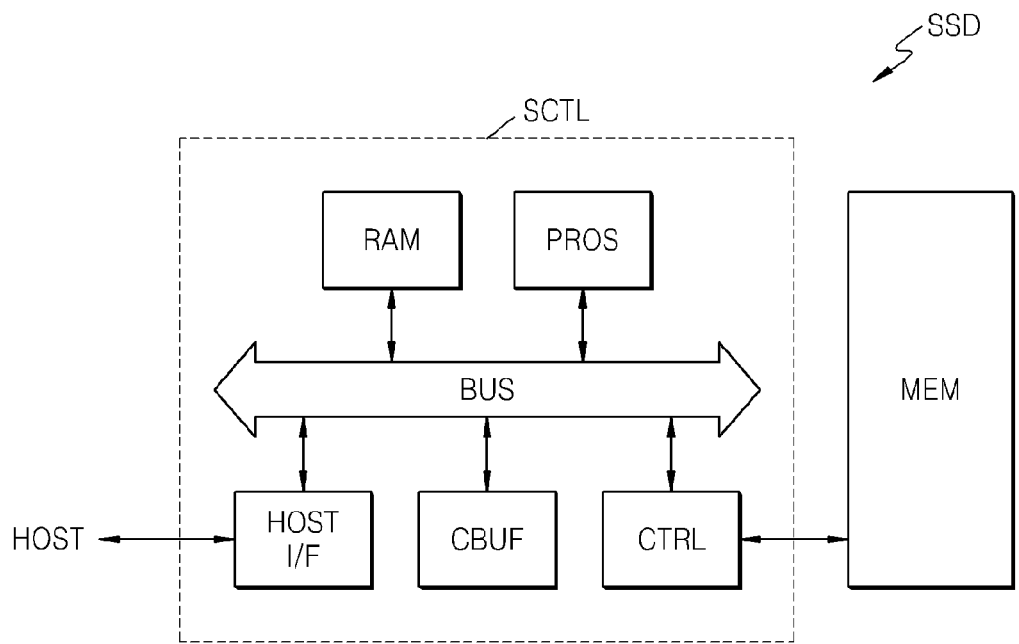
FIG. 3 is a block diagram showing a solid-state drive (SSD) in more detail, according to an example embodiment of inventive concepts.
Figure 4:
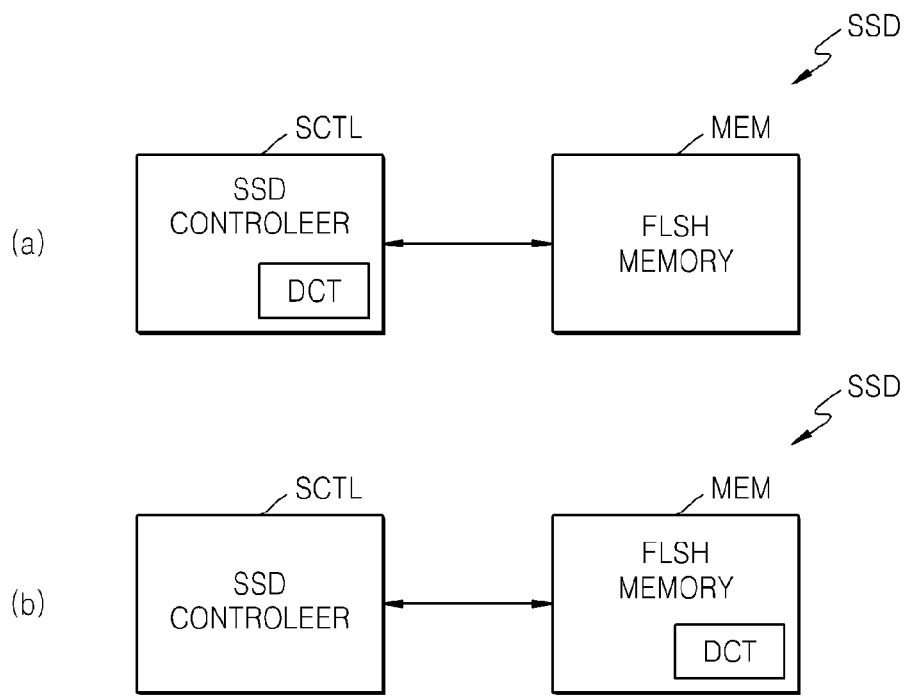
FIG. 4 illustrates the data compression unit of FIG. 2 that may be disposed in different positions, according to at least one example embodiment of inventive concepts.

FIG. 3 is a block diagram showing the SSD in more detail, according to an example embodiment of inventive concepts, and FIG. 4 illustrates the data compression unit DCT of FIG.

2 that may be disposed in different positions, according to example embodiments of inventive concepts.

Referring to FIG. 3, the SSD may include an SSD controller SCTL and a flash memory MEM. The SSD controller SCTL may include a processor PROS, a random access memory (RAM), a cache buffer CBUF, and a memory controller Ctrl, which are to be connected to a bus BUS. The processor PROS controls the memory controller Ctrl to transmit and receive data to and from the flash memory MEM in response to a request (command, address, data) of a host (not shown). The processor PROS and the memory controller Ctrl of the SSD may be implemented by one ARM processor. Data required for an operation of the processor PROS may be loaded on the RAM.

A host interface HOST I/F receives the request of the host and transmits the request to the processor PROS or transmits data transmitted by the flash memory MEM to the host. The host interface HOST I/F may interface with the host by using various interface protocols, such as Universal Serial Bus (USB), Man Machine Communication (MMC), Peripheral Component Interconnect-Express (PCI-E), Serial Advanced Technology Attachment (SATA), Parallel Advanced Technology Attachment (PATA), Small Computer System Interface (SCSI), Enhanced Small Device Interface (ESDI), and Intelligent Drive Electronics (IDE). The data to be transmitted to the flash memory MEM or by the flash memory MEM may be temporarily stored in the cache buffer CBUF. The cache buffer CBUF may be a static RAM (SRAM) or the like.

In this regard, the data compression unit DCT of FIG. 2 may be disposed on the SSD controller SCTL, as illustrated in (a) of FIG. 4, or on the flash memory MEM, as illustrated in (b) of FIG. 4. In particular, the data compression unit DCT of FIG. 2 may be disposed on a compression engine (not shown) included in the SSD controller SCTL or the flash memory MEM. The SSD including the data compression unit DCT of FIG. 2 may be included in a server system SSYS connected to a network system NSYS, as illustrated in FIG. 5.

Figure 5:
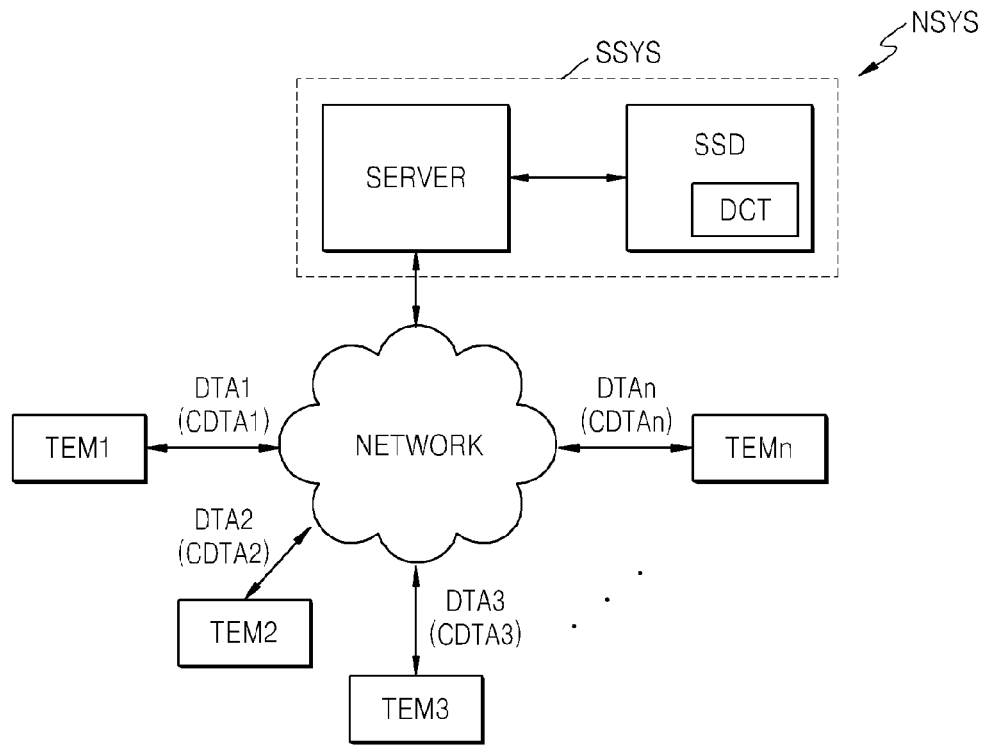
FIG. 5 illustrates a network system including the data compression unit of FIG. 2 according to an example embodiment.

FIG. 5 illustrates the network system NSYS including the data compression unit DCT of FIG. 2. Referring to FIG. 5, the network system NSYS may include the server system SSYS and a plurality of terminals TEM1, TEM2, TEM3, ..., and TEMn, which are connected to one another via a network. The server system SSYS may include a server SERVER that processes requests received from the plurality of terminals TEM1, ..., and TEMn and an SSD that stores data corresponding to the requests received from the terminals TEM1, ..., and TEMn. In this regard, the SSD of FIG. 5 may be the SSD of FIG. 3. The SSD of FIG. 5 may include the SSD controller SCTL and the flash memory MEM of FIG. 3.

Data to be transmitted from the terminals TEM1, ..., and TEMn to the server system SSYS and stored in the server system SSYS, for example, program data PDTA, may be compressed in units of chunk data CDTA before being stored in the flash memory MEM, by using the Huffman coding method, in particular. However, the server system SSYS of FIG. 5 may transmit and receive a similar type of data to and from the terminals TEM1, ..., and TEMn, which are connected to the server system SSYS via the network.

For example, pieces of data from the terminals TEM1, ..., and TEMn so as to be stored in the SSD may have the same compressibility, for example, about 50%. In detail, first data DTA1 transmitted from a first terminal TEM1, second data DTA2 transmitted from a second terminal TEM2, and third data DTA3 transmitted from a third terminal TEM3 may be multimedia data and may be compressed with the same compressibility. Data transmitted from other terminals, for example, n-th data DTAn transmitted from an n-th terminal TEMn, may be compressed with the same compressibility. Due to characteristics of data compression, it may be not easy to compress different types of data with completely the same compressibility. Thus, the case where data are compressed with the same compressibility includes the case where a difference in compressibility of pieces of data DTA1, ..., and DTAn is within a predetermined range.

Figure 6:
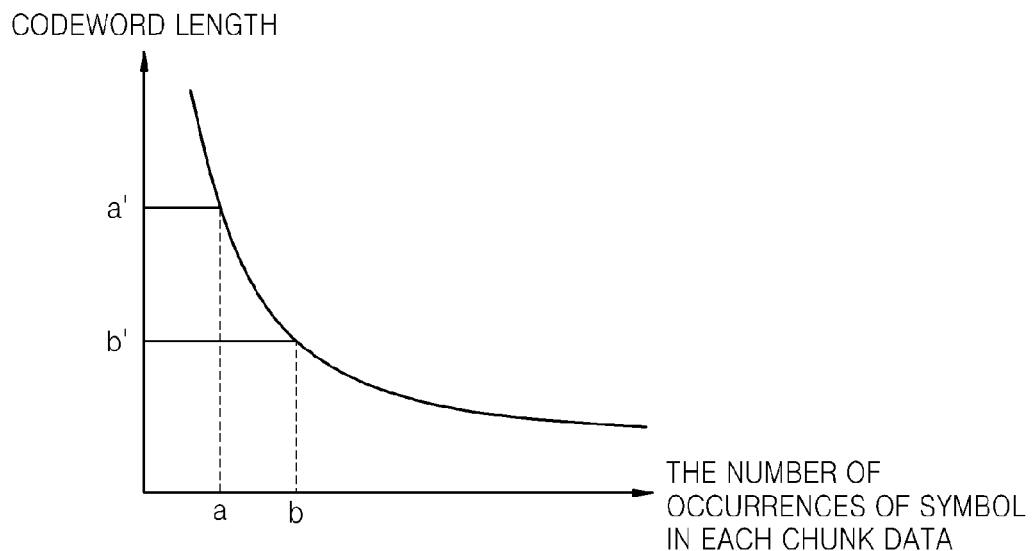
FIG. 6 is a graph showing the relationship between the number of occurrences and a codeword length of a symbol of each chunk data.

FIG. 6 is a graph showing the relationship between the number of occurrences of a symbol in each chunk data and a codeword length of each symbol in chunk data CDTA. When the pieces of data DTA1, ..., and DTAn are Huffman-coded in units of chunk data CDTA1, ..., and CDTAn so as to compress the pieces of data DTA1, ..., and DTAn having similar data characteristics before being stored in the SSD through a server, the relationship between the number of occurrences NUM and a codeword length LEN of a symbol SYM of chunk data CDTA1, ..., and CDTAn may be similar in each of the chunk data CDTA1, ..., and CDTAn. For example, in the relationship between the number of occurrences NUM and a codeword length LEN of a symbol SYM of each of chunk data CDTA1, ..., and CDTAn, if the number of occurrences NUM of a symbol SYM is a, a codeword length LEN may be a', and if the number of occurrences NUM of a symbol SYM is b, a codeword length LEN may be b', as illustrated in FIG. 6.

In other words, in each of first chunk data CDTA1 of the first data DTA1 transmitted from the first terminal TEM1, second chunk data CDTA2 of the second data DTA2 transmitted from the second terminal TEM2, and third chunk data CDTA3 of the third data DTA3 transmitted from the third terminal TEM3, a codeword length LEN of a' may be allocated to a symbol SYM having the number of occurrences NUM of a, and a codeword length LED of b' may be allocated to a symbol SYM having the number of occurrences NUM of b. This also applies to chunk data transmitted from other terminals, for example, n-th chunk data DTAn transmitted from the n-th terminal TEMn.

In the method of compressing data in a storage device (100) and the data compression unit DCT, a first table TABL1 in which the relationship between the number of occurrences NUM and a codeword length LEN of a symbol SYM in each chunk data CDTA is defined, is configured so that an operation of forming the Huffman tree as below may be omitted. An example in which the Huffman tree is formed may be described with reference to FIGS. 2, 7, and 8.

Figure 7:
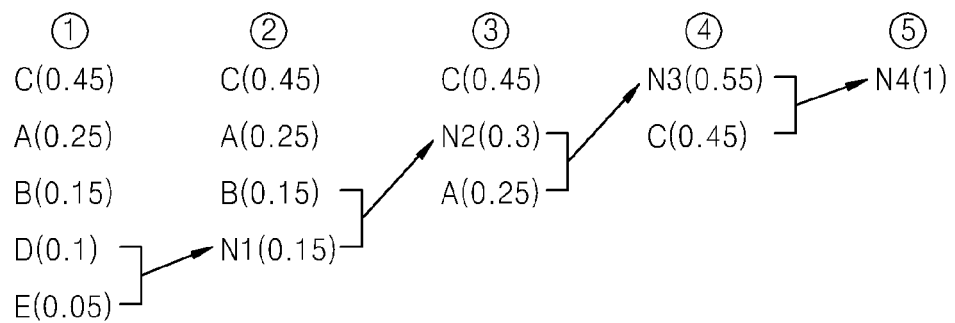
FIGS. 7 and 8 illustrate a method of allocating a codeword length based on a probability of the number of occurrences of each symbol by generating the Huffman tree.
Figure 8:
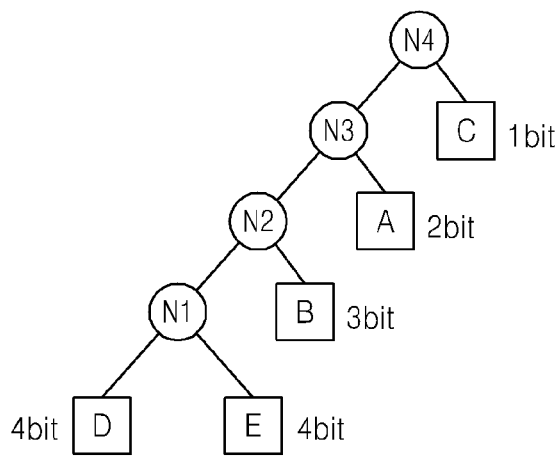

FIGS. 7 and 8 illustrate a method of allocating a codeword length based on a probability of the number of occurrences of each symbol by generating the Huffman tree. Referring to FIGS. 2, 7, and 8, symbols SYM included in chunk data CDTA are A, B, C, D, and E. In the example, if the number of occurrences NUM of a symbol SYM is converted into a probability, the symbol A has a probability of 0.25, and the symbol B has a probability of 0.15, and the symbol C has a probability of 0.45, and the symbol D has a probability of 0.1, and the symbol E has a probability of 0.05. If the symbols SYM are aligned in the order of the number of occurrences NUM, i.e., in the order of probabilities of the small number of occurrences, the symbols SYM may be aligned in the order of E, D, B, A, and C, as illustrated in 1̂ of FIG. 7. Next, a symbol N1 having a probability of 0.15 is generated by adding the two symbols E and D having probabilities of the relatively small number of occurrences. Then, the symbols B, A, C, and N1 may be aligned in the order of probabilities of the small number of occurrences, as illustrated in 2̂ of FIG. 7. Similarly, a symbol N2 having a probability of 0.3 is generated by adding the symbols B and N1 having probabilities of the relatively small number of occurrences among the symbols B, A, C, and N1. As described above, the symbols A, B, C, D, E, N1, and N2 are aligned based on sizes of probabilities of the number of occurrences, and an operation of adding two symbols having probabilities of the relatively small number of occurrences is repeatedly performed until the sum of the probabilities of the number of occurrences is 0. Thus, when the symbols A, C, and N2 are aligned, the result of alignment is as illustrated in ③ of FIG. 7, and a symbol N3 having a probability of 0.55 is generated by adding the symbols A and N2 having probabilities of the relatively small number of occurrences. When, in ④ of FIG. 6, the symbol N3 having a probability of 0.55 and the symbol C having a probability of 0.45 are added to each other, N4 having a probability of 1 that is the sum of the probability 0.55 of the symbol N3 and the probability 0.45 of the symbol C is generated, as illustrated in ⑤ of FIG. 7.

In this way, when the operation of aligning symbols so as to generate Huffman codewords is completed, the Huffman tree illustrated in FIG. 8 is generated. Lengths of codewords according to the number of occurrences of symbols are determined based on the Huffman tree. In the example of FIG. 8, each of lengths of codewords to be allocated to the symbols D and E is determined as 4-bit, and a codeword length to be allocated to the symbol B is determined as 3-bit, and a codeword length to be allocated to the symbol A is determined as 2-bit. A codeword length to be allocated to the symbol C is determined as 1-bit.

However, when the alignment operation of FIG. 7 is repeatedly performed, the amount of calculation required for data compression is increased, and latency of an operation of the data compression unit DCT occurs. In the method of compressing data in a storage device (100) and the data compression unit DCT according to at least some example embodiments, the first table TABL1 indicating the relationship between the number of occurrences NUM and a codeword length LEN of a symbol SYM in each chunk data CDTA is used so that an increase in the amount of calculation required for generation of the Huffman tree and latency of an operation of the data compression unit DCT may be reduced while maintaining compression efficiency. This will be described in more detail.

Referring back to FIGS. 1 and 2, the data receiver DREV receives the chunk data CDATA in operation S120. As described above, the chunk data CDTA may be data obtained by dividing the program data PDTA in units of compression. Although the data receiver DREV receives the chunk data CDTA in FIG. 2 and the following drawings, inventive concepts are not limited thereto. The data receiver DREV may receive the program data PDTA and may divide the program data PDTA into the chunk data CDTA.

The counter CNT counts the number of occurrences NUM of symbols SYM that constitute the chunk data CDTA in operation S142. For example, the counter CNT may count that a symbol "0000000011111111" has been generated in the chunk data CDTA three times and a symbol "0101010101010101" has been generated in the chunk data CDTA 90 times. The counter CNT transmits the counted number of occurrences NUM to the codeword length determiner CLD. The codeword length determiner CLD determines a codeword length LEN corresponding to the number of occurrences NUM of a symbol SYM by referring to the first table TABL1 stored in the table storage unit TST in operation S144.

The table storage unit TST may output the codeword length LEN corresponding to the number of occurrences NUM of the symbol SYM in response to a request REQ transmitted from the codeword length determiner CLD. The request REQ transmitted from the codeword length determiner CLD may include a value indicating the number of occurrences NUM of the symbol SYM. The first table TABL1 may be as illustrated in FIG. 9. FIG. 9 illustrates an example of a first table according to an example embodiment of inventive concepts. For example, the first table TABL1 may be set in such a way that, when the number of occurrences NUM of a symbol SYM is 1, a codeword length LEN of the symbol SYM may be mapped to 12 and when the number of occurrences NUM of a symbol SYM is 2, a codeword length LEN of the symbol SYM may be mapped to 11 and when the number of occurrences NUM of a symbol SYM is 3 to 4, a codeword length LEN of the symbol SYM may be mapped to 10.

The first table TABL1 may be provided by the host or controller and may be stored in the table storage unit TST. Alternatively, the first table TABL1 may be generated by the data compression unit DCT. A more detailed description of a method of generating the first table TABL1 by using the data compression unit DCT will be provided later.

Referring back to FIGS. 1 and 2, the codeword length determiner CLD determines a codeword length LEN of the symbol "0000000011111111" that has been generated three times as 10 and a codeword length LED of the symbol "0101010101010101" that has been generated 90 times as 5, as in the above example, by referring to the first table TABL1 as illustrated in FIG. 9.

The codeword length determiner CLD transmits the codeword length LEN determined for each symbol SYM to the codeword determiner CWD. The codeword determiner CWD determines a codeword CWRD having the codeword length LEN in operation S146. For example, the codeword determiner CWD may determine the symbol "0000000011111111" as a codeword "0001100011" having a length of 10 and the symbol "0101010101010101" as a codeword "11110" having a length of 5. In this regard, the codeword determiner CWD may determine an arbitrary codeword among a plurality of codewords having the same length. For example, the codeword determiner CWD may determine the symbol "0101010101010101" in the above example as not a codeword "11110" having a length of 5 but a codeword "01010" having a length of 5.

The codeword determiner CWD may determine a codeword CWRD having a codeword length LEN randomly. Alternatively, the codeword determiner CWD may determine a codeword CWRD having a codeword length LEN in response to a control signal (not shown) transmitted from the outside.

The symbol conversion unit SCU converts each symbol SYM into a codeword CWRD in operation S160. In the above example, the symbol conversion unit SCU converts "0000000011111111" in the chunk data CDTA into a codeword "0001100011" and converts "0101010101010101" in the chunk data CDTA into a codeword "11110". Thus, the symbol conversion unit SCU generates compressed data COMD of each chunk data CDTA. The compressed data COMD may be stored in the flash memory MEM.

There may be various embodiments in which, in order for the symbol conversion unit SCU to convert each symbol SYM of the chunk data CDTA into a codeword CWRD, the symbol conversion unit SCU may receive the chunk data CDTA from the data receiver DREV or may receive the chunk data CDTA directly without passing through the data receiver DREV. Thus, FIG. 2 does not illustrate the case where the chunk data CDTA is input to the symbol conversion unit SCU.

Figure 10:
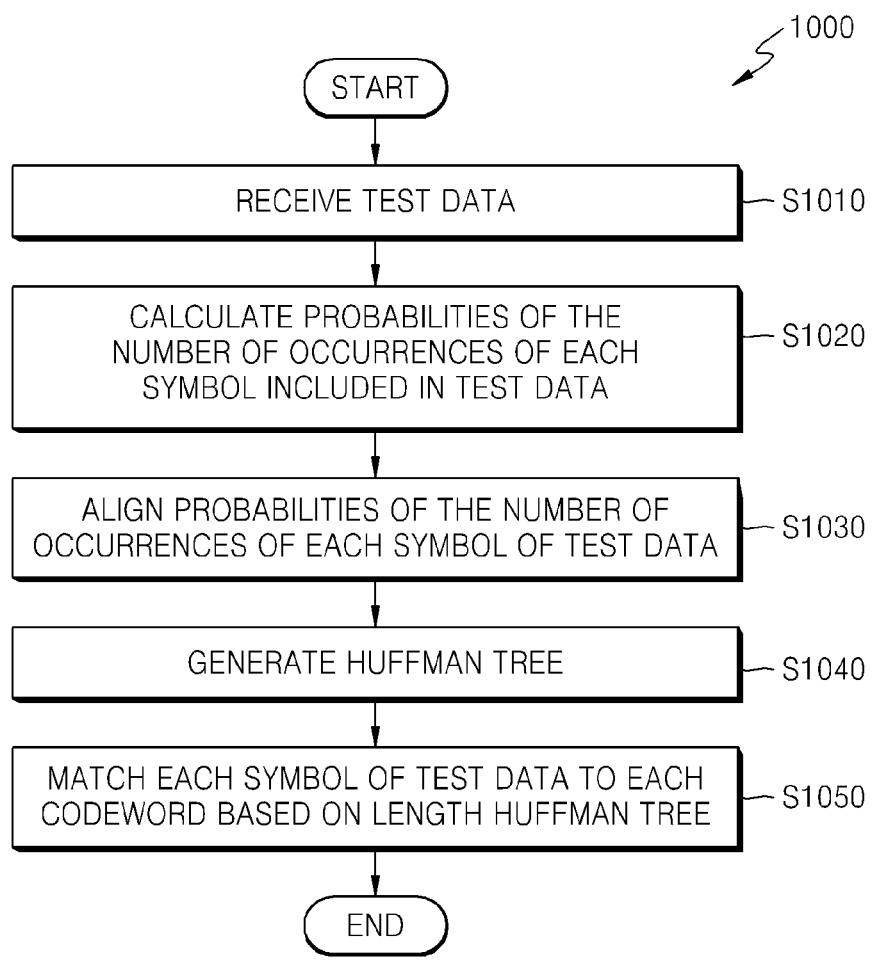
FIG. 10 is a flowchart illustrating a method of generating a first table according to an example embodiment of inventive concepts.
Figure 11:
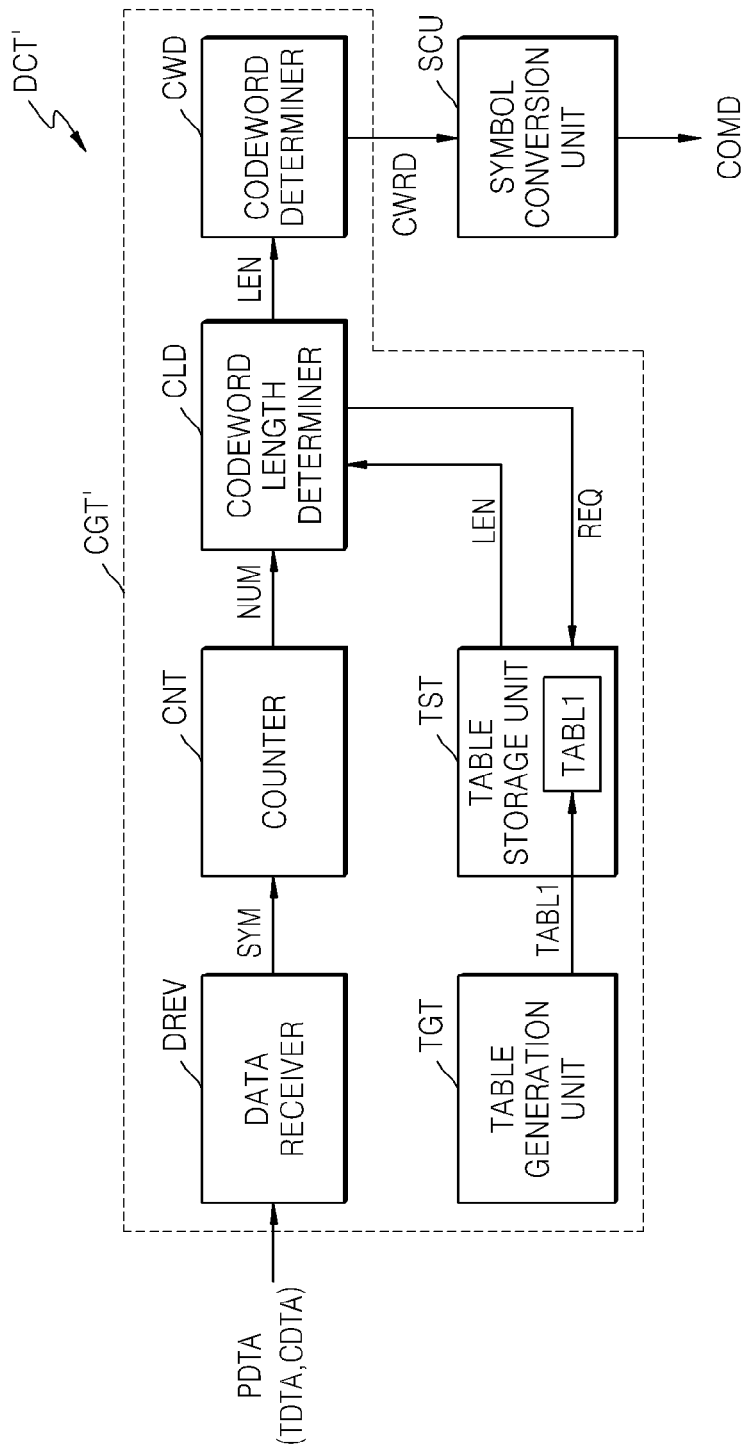
FIG. 11 is a block diagram of the structure of a data compression unit so as to explain the method of generating a first table illustrated in FIG. 10.

Hereinafter, a method of generating the first table TABL1 according to an example embodiment of inventive concepts will be described. FIG. 10 is a flowchart illustrating the method of generating the first table TABL1 (1000) according to an example embodiment of inventive concepts, and FIG. 11 is a block diagram of the structure of a data compression unit DCT' so as to explain the method of generating the first table TABL1 (1000) illustrated in FIG. 10. Referring to FIGS. 10 and 11, in the data compression unit DCT', in order to form the first table TABL1, first, the data receiver DREV in a codeword generation unit CGT' receives test data TDTA in operation S1010. The test data TDTA may be part of the program data PDTA and may be the same type of data as the chunk data CDTA. In other words, the test data TDTA may have the same size as that of the chunk data CDTA or the same decoding method as that of the chunk data CDTA. Furthermore, the test data TDTA may be the chunk data CDTA. In other words, in the method of generating the first table TABL1 (1000), the chunk data CDTA received at an initial stage (when the data compression unit DCT' is enabled or when the data compression unit DCT' performs an operation of generating the first table TABL1 or an updating operation) among the chunk data CDTA may be used, or arbitrary chunk data CDTA may be randomly sampled so as to form the first table TABL1.

The first table TABL1 indicating the relationship between each symbol SYM included in the test data TDTA and the number of occurrences NUM of the symbol SYM may be formed by using a table generation unit TGT that may be further included in the data compression unit DCT'. In this regard, the relationship between each symbol SYM and the number of occurrences NUM of the symbol SYM may be set by generating the Huffman tree described with reference to FIGS. 7 and 8.

In other words, the table generation unit TGT may calculate probabilities of the number of occurrences of each symbol SYM of the test data TDTA in operation S1020 and may align the probabilities of the number of occurrences of each symbol SYM of the test data TDTA in operation S1030 and thereby generating the Huffman tree in operation S1040. Next, the table generation unit TGT may generate the first table TABL1 by matching each symbol SYM of the test data TDTA and the codeword length LEN based on the Huffman tree with respect to the test data TDTA in operation S1050.

As described above, the example where a codeword length is determined by using one table has been described. However, inventive concepts are not limited thereto. In a method of compressing data in a storage device and the data compression unit according to another example embodiment of inventive concepts, one may be selected from a plurality of tables, and a codeword length may be determined using the selected table. This will now be described.

Figure 12:
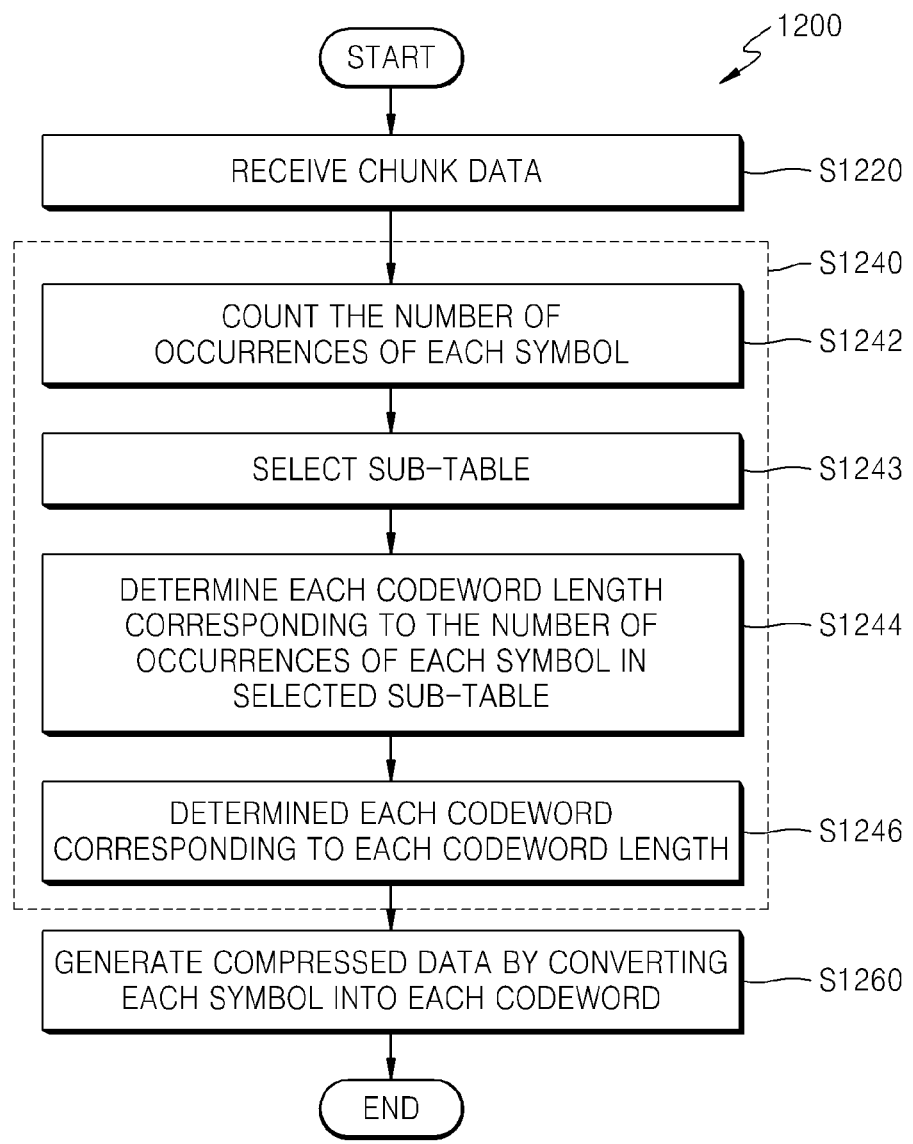
FIG. 12 is a flowchart illustrating a method of compressing data in an SSD, according to another example embodiment of inventive concepts.
Figure 13:
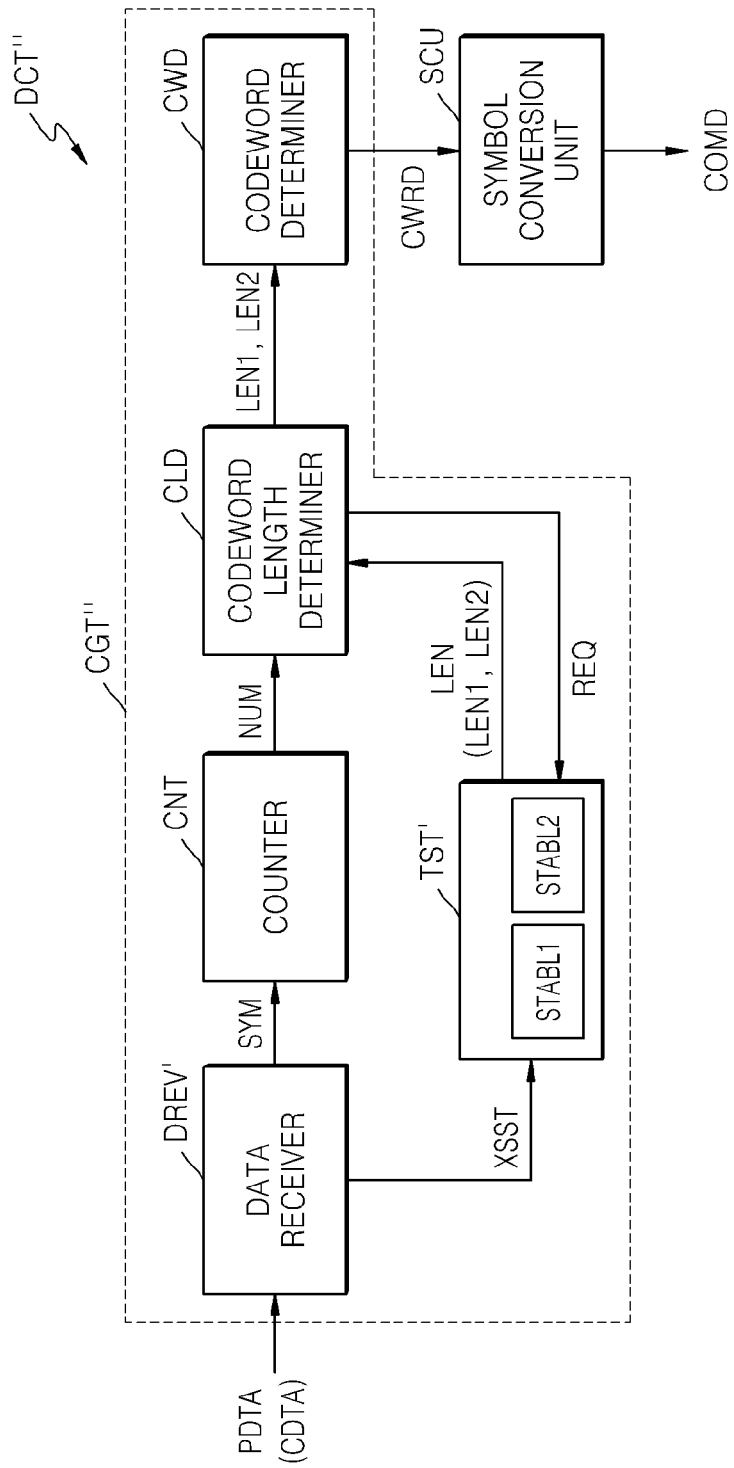
FIG. 13 is a block diagram of a data compression unit that operates by using the method of compressing data in an SSD illustrated in FIG. 12 according to an example embodiment.

FIG. 12 is a flowchart illustrating a method of compressing data in an SSD (1200), according to another example embodiment of inventive concepts, and FIG. 13 is a block diagram of a data compression unit DCT'' that operates by using the method of compressing data in an SSD (1200) illustrated in FIG. 12, and FIG. 14 illustrates an example of a second table according to another example embodiment of inventive concepts.

Referring to FIGS. 12 and 13, the method of compressing data in an SSD (1200) and the data compression unit DCT according to another example embodiment of inventive concepts is performed and operates in a similar manner as that of the method of compressing data in a storage device (100) illustrated in FIG. 1 and the data compression unit DCT illustrated in FIG. 2, respectively. In detail, in the method of compressing data in an SSD (1200) and the data compression unit DCT'', chunk data CDTA is received from the data receiver DREV' in a codeword generation unit CGT'' in operation S1220, and the number of occurrences NUM of each symbol SYM of the chunk data CDTA is counted by the counter CNT in operation S1242, and a codeword length determiner CLD' determines a codeword length LEN corresponding to the number of occurrences NUM of each symbol SYM by using a table in operation S1244. In addition, in the method of compressing data in an SSD (1200) and the data compression unit DCT''', a codeword CWRD corresponding to the codeword length LEN of each symbol SYM is determined by a codeword determiner CWD' in operation S1246, and each symbol SYM is converted into a codeword CWRD by a symbol conversion unit SCU so that compressed data COMD may be generated in operation S1260. Similarly, the first table TABL1 is stored in a table storage unit TST'.

In the method of compressing data in an SSD (1200) illustrated in FIG. 12 and the data compression unit DCT'' illustrated in FIG. 13, when the codeword CWRD is generated by using the codeword generation unit CGT'' in operation S1240, one table is selected from a plurality of sub-tables STABL1 and STABL2, and the codeword length LEN is determined using the selected sub-table. Thus, the table storage unit TST' of FIG. 13 may store a plurality of sub-tables, for example, a first sub-table STABL1 and a second sub-table STABL2. Each of the plurality of sub-tables STABL1 and STABL2 may be generated by performing the method of generating the first table TABL1 described above.

One of the first sub-table STABL1 and the second sub-table STABL2 may be selected based on compressibility of the chunk data CDTA. For example, when the first sub-table STABL1 is the same as the first table TABL1 of FIG. 9 and the second sub-table STABL2 is the same as the second table TABL2 of FIG. 14, in order to improve compressibility of the chunk data CDTA, the second sub-table STABL2 in which a codeword length LEN2 with respect to the number of occurrences NUM of each symbol SYM is smaller than a codeword length LEN1 in the first sub-table STABL1 may be selected.

When the second table TABL2 of FIG. 14 is used, in the above-described example, the codeword length determiner CLD' may determine the codeword length LEN2 of a symbol "0000000011111111" that has been generated three times, as 8 and may determine the codeword length LEN2 of a symbol "0101010101010101" that has been generated 90 times as 3.

Selecting of the sub-table (S1243) may be performed in response to a selection signal XSST transmitted from the data receiver DREV'. The selection signal XSST may include information about the relationship between compressibility of the chunk data CDTA and the sub-table. FIG. 13 illustrates that the selection signal XSST is transmitted from the data receiver DREV'. However, inventive concepts are not limited thereto. The selection signal XSST may be included in a request REQ of the codeword length determiner CLD' for the table storage unit TST' and may be transmitted to the table storage unit TST'. Alternatively, the selection signal XSST may also be transmitted from an external host (not shown) or a controller (not shown).

FIGS. 12 and 13 illustrate the example where the sub-table is selected based on compressibility of the chunk data CDTA. However, inventive concepts are not limited thereto.

Figure 15:
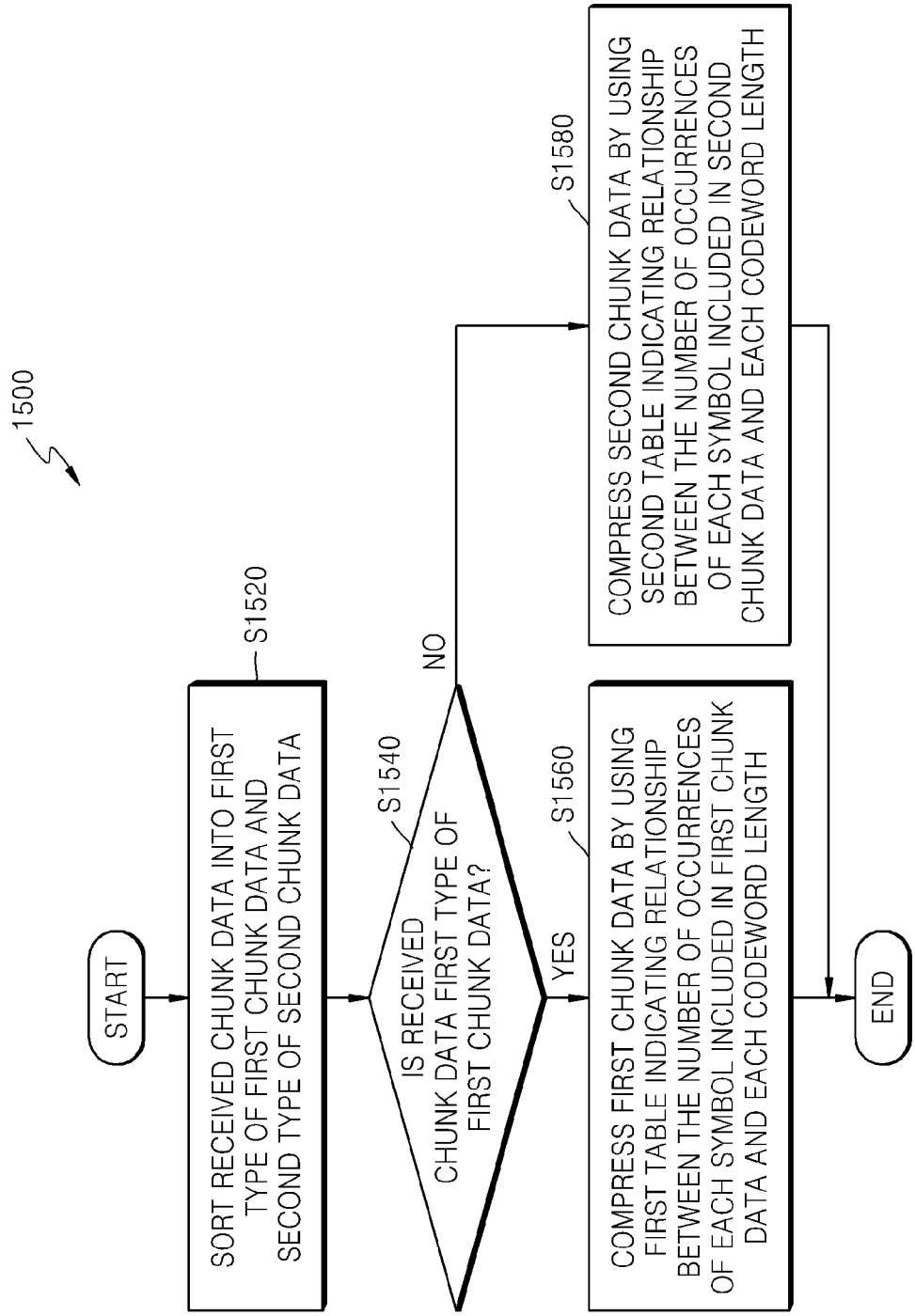
FIG. 15 is a flowchart illustrating a method of compressing data in an SSD, according to another example embodiment of inventive concepts.
Figure 16:
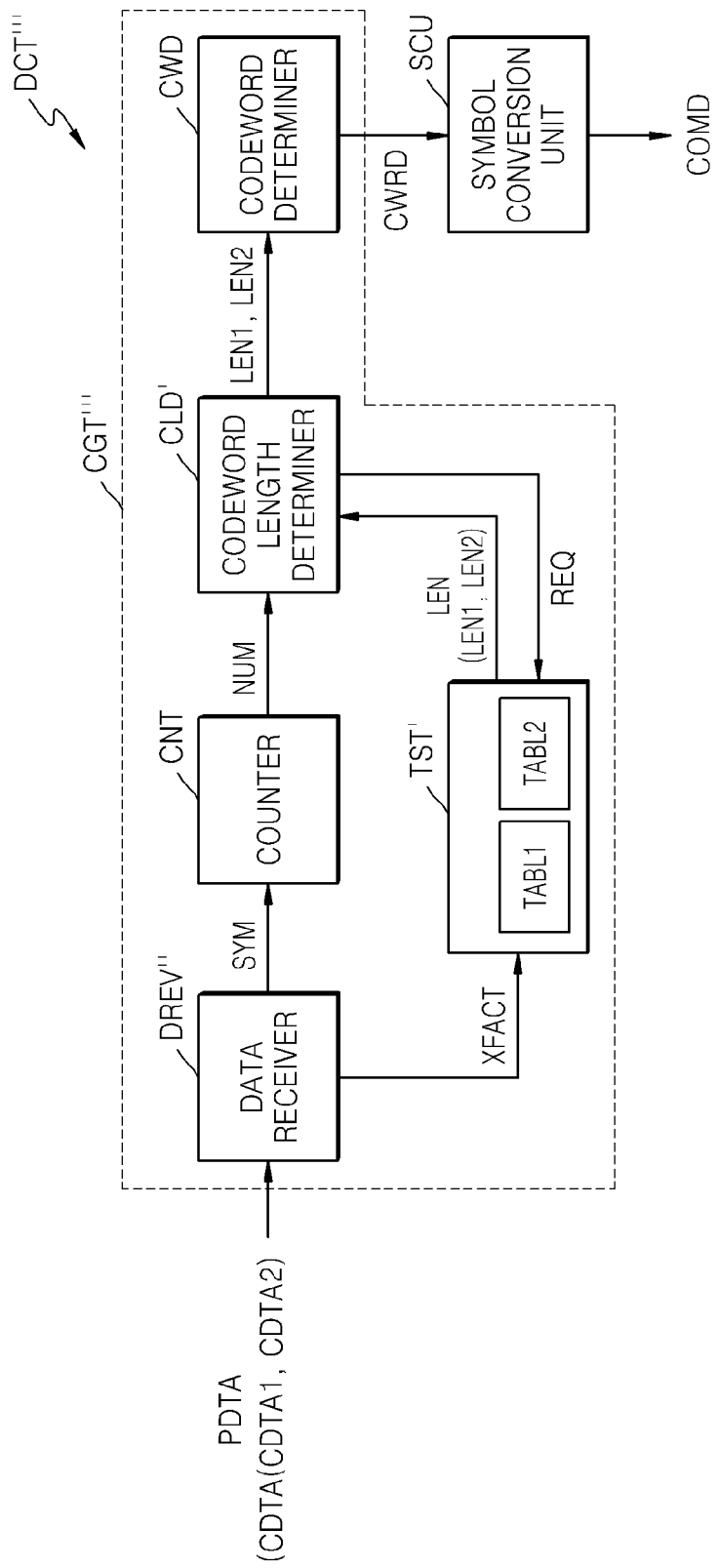
FIG. 16 is a block diagram of a data compression unit that operates by using the method of compressing data in an SSD illustrated in FIG. 15 according to an example embodiment.
Figure 17:
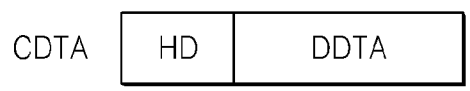
FIG. 17 is a block diagram of the structure of each chunk data according to an example embodiment of inventive concepts.

FIG. 15 is a flowchart illustrating a method of compressing data in an SSD (1500), according to another example embodiment of inventive concepts, and FIG. 16 is a block diagram of a data compression unit DCT''' that operates by using the method of compressing data in an SSD (1500) illustrated in FIG. 15, and FIG. 17 is a block diagram of the structure of each chunk data CDTA according to an example embodiment of inventive concepts. Referring to FIGS. 15 and 16, chunk data CDTA received by a data receiver DREV'' are sorted into a first type of first chunk data CDTA1 and a second type of second chunk data CDTA2 in operation S1520. When the chunk data CDTA is the first type of first chunk data CDTA1 (in case of "YES" of operation S1540), the first chunk data CDTA1 may be compressed using a first table TABL1 indicating the relationship between the number of occurrences NUM of each symbol SYM included in the first chunk data CDTA1 and a codeword length LEN in operation S1560. On the other hand, when the chunk data CDTA is the second type of second chunk data CDTA2 (in case of "NO" of operation S1540), the second chunk data CDTA2 may be compressed using a second table TABL2 indicating the relationship between the number of occurrences NUM of each symbol SYM included in the second chunk data CDTA2 and a codeword length LEN in operation S1580.

The table storage unit TST' of FIG. 16 may store the first table TABL1 and the second table TABL2. The table storage unit TST' may transmit one of a first codeword length LEN1 of the first table TABL1 and a second codeword length LEN2 of the second table TABL2 that respectively correspond to the number of occurrences of each symbol SYM in response to a characteristic signal XFACT indicating data characteristics of the chunk data CDTA, to the codeword length determiner CLD' when the request REQ of the codeword length determiner CLD' is received. FIG. 16 illustrates that the characteristic signal XFACT is transmitted from the data receiver DREV". However, inventive concepts are not limited thereto. As will be described later, the characteristic signal XFACT generated from information detected from a header HD of the chunk data CDTA may be included in the request REQ of the codeword length determiner CLD' for the table storage unit TST' and may be transmitted to the table storage unit TST'.

In detail, in FIGS. 15 and 16, a table (a codeword length) may be selected differently according to the data characteristics of the chunk data CDTA. In this regard, the data characteristics of the chunk data CDTA may be detected from the information included in the header HD of FIG. 17 that constitutes the chunk data CDTA. The header HD of the chunk data CDTA may include information about a decoding method of data DDTA to be stored in the flash memory MEM, the size of the decoded data DDTA, or the like. Various compression units may be used in the SSD. In this regard, the size of the chunk data CDTA (or the decoded data DDTA) may be diverse. The information included in the header HD may be recognized as the data characteristics of the chunk data CDTA.

As described above, in FIGS. 15 and 16, the sub-table may be selected in response to the characteristic signal XFACT indicating the data characteristics of the chunk data CDTA. For example, when the size of the decoded data DDTA of the first chunk data CDTA1 is greater than that of the decoded data DDTA of the second chunk data CDTA2, the first table TABL1 in which a codeword length corresponding to the number of occurrences of each symbol SYM is relatively long compared to the second table TABL2, may be selected.

Figure 18:
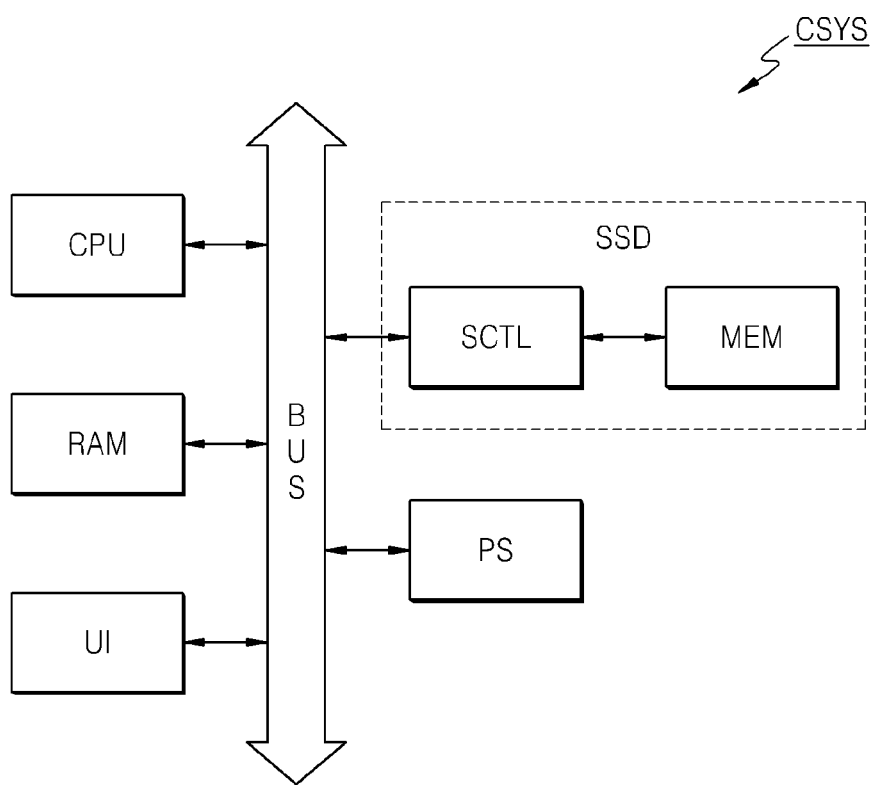
FIG. 18 illustrates a computing system according to an example embodiment of inventive concepts.

FIG. 18 illustrates a computing system CSYS according to an example embodiment of inventive concepts. Referring to FIG. 18, the computing system CSYS includes a processor CPU, a user interface UI, and an SSD, which are electrically connected to a bus BUS. The SSD includes an SSD controller SCTRL and a flash memory MEM. N-bit data processed or to be processed by the processor CPU (where N is 1 or an integer that is greater than 1) may be stored in the flash memory MEM via the SSD controller SCTRL. The SSD of FIG. 18 may be an SSD of FIG. 2.

The computing system CSYS may further include a power supply PS. In addition, the computing system CSYS may further include a system memory, for example, random access memory (RAM).

When the computing system CSYS is a mobile system, a battery for supplying an operating voltage of the computing system CSYS and a modem, such as a baseband chipset, may be additionally provided. In addition, it should be understood that an application chipset, a camera image processor (CIS), a mobile DRAM, and the like may be further provided. Thus, a detailed description thereof will not be provided here.

While inventive concepts have been particularly shown and described with reference to example embodiments thereof, it will be understood that various changes in form and details may be made therein without departing from the spirit and scope of the following claims.

What is claimed is:

1. A method of compressing data in a storage device, the method comprising:
   determining a codeword length of a symbol using a first table indicating a relationship between a number of occurrences of the symbol in received data and the codeword length;
   determining a codeword having the codeword length for the symbol; and
   generating compressed data of the received data, the generating including converting the symbol into the codeword.

2. The method of claim 1, wherein the determining a codeword length comprises:
   determining the number of occurrences of the symbol in the received data; and
   determining the codeword length corresponding to the number of occurrences of the symbol in the received data using the first table.

3. The method of claim 1, further comprising:
   generating the first table.

4. The method of claim 3, wherein the generating the first table comprises:
   receiving test data;
   calculating probabilities of a number of occurrences of each symbol in the test data;
   generating a Huffman tree based on the probabilities; and
   matching each symbol in the test data to at least one of the codeword lengths corresponding to each symbol based on the Huffman tree.

5. The method of claim 4, wherein the generating the first table comprises:
   generating the first table based on the Huffman tree.

6. The method of claim 4, wherein the first table comprises:
   a first sub-table indicating a first relationship between each symbol and each codeword length and a second sub-table indicating a second relationship between each symbol and each codeword length.

7. The method of claim 6, wherein the generating the compressed data of the received data comprises:
   selecting one of the first sub-table and the second sub-table; and
   determining each codeword length using the selected sub-table.

8. The method of claim 7, wherein the selecting the sub-table comprises:
   selecting the sub-table based on compressibility of the received data.

9. The method of claim 1, wherein the storage device comprises:
   a solid-state drive (SSD).

10. A method of compressing data in a storage device, the method comprising:
- sorting data into a first type of first data and a second type of second data;
- first determining first codeword lengths corresponding to symbols in the first data using a first table indicating a relationship between a number of occurrences of each symbol in the first data and the determined first codeword length;
- first compressing the first data by converting each symbol in the first data into a corresponding first codeword having the corresponding first codeword length;
- second determining second codeword lengths corresponding to symbols included in the second data using a second table indicating a relationship between the number of occurrences of each symbol in the second data and the determined second codeword length; and
- second compressing the second data by converting each symbol in the second data into a second corresponding codeword having the corresponding second codeword length.

11. The method of claim 10, wherein the first determining first codeword lengths includes,
- determining the number of occurrences of each symbol included in the first data,
- determining each first codeword length corresponding to the number of occurrences of each symbol in the first data on the first table, and the first compressing includes,
- determining each corresponding first codeword based on the determined first codeword length, and
- converting each symbol in the first data into each corresponding first codeword.

12. The method of claim 11, wherein the second determining second codeword lengths includes,
- determining the number of occurrences of each symbol included in the second data,
- determining each second codeword length corresponding to the number of occurrences of each symbol in the second data on the second table, and the second compressing includes,
- determining each second codeword based on the determined second codeword length, and
- converting each symbol in the second data into each corresponding second codeword.

13. The method of claim 10, wherein the data comprises decoded data and a header indicating a parameter regarding the decoded data.

14. The method of claim 13, wherein the sorting the data into the first type of first data and the second type of second data comprises:
- sorting the data into one of the first data and the second data based on the parameter.

15. The method of claim 10, wherein the storage device is included in a server.

16. A method of compressing data, the method comprising:
- receiving data, the data including a plurality of symbols;
- determining a number of occurrences at least one of the plurality of symbols in the data;
- determining a codeword length of the at least one symbol using a table, the table indicating a relationship between the number of occurrences and the codeword length; and
- converting the at least one symbol into a codeword having the codeword length.

17. The method of claim 16, further comprising:
- receiving test data;
- generating a Huffman tree based on the test data; and
- generating the table based on the Huffman tree.

18. The method of claim 16, wherein the determining a codeword length includes,
- selecting one of a plurality of sub-tables of the table, each sub-table indicating a different correspondence between each symbol and each codeword length, and
- determining a codeword length of the at least one symbol using the determined sub-table.

19. The method of claim 16, wherein the received data including a plurality of symbols is a unit for compressing data to be programmed in a SSD (Solid State Drive).

* * * * *